United States Patent
Angelici et al.

(10) Patent No.: US 6,441,762 B2
(45) Date of Patent: *Aug. 27, 2002

(54) CIRCUIT DEVICE FOR CANCELLING OUT SPURIOUS PULSES IN A SWITCHED CAPACITANCE LOW-PASS FILTER, AND A FILTER INCORPORATING IT

(75) Inventors: Marco Angelici, Galliate Lombardo; Marco Ronchi, Cavenago Brianza, both of (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,177

(22) Filed: Jun. 25, 1999

(30) Foreign Application Priority Data

Jun. 26, 1998 (EP) .............................. 98830386

(51) Int. Cl.[7] ............................. H03M 1/66; H03M 1/12
(52) U.S. Cl. ........................ 341/150; 341/172; 327/95; 327/96
(58) Field of Search ................................ 341/150, 172; 327/95, 96

(56) References Cited

U.S. PATENT DOCUMENTS 5,391,999 A 2/1995 Early et al. .................. 327/337
5,689,201 A * 11/1997 Temes et al. .................. 327/95

OTHER PUBLICATIONS

Fischer, G.; Davis, A. J. "VLSI implementation of a wide-band sonar receiver" 2000 IEEE International Symposium vol. 5, pp. 673–676.*

Taylor, J.T. et al., "Realisation of High Frequency GaAs Switched Capacitor Filters Using Insulated Gate Switches," *Analog Circuits And Neural Networks*, Singapore, Jun. 11–14, 1991, pp. 1661–1664, XP000370923, *Institute of Electrical Engineers*.

* cited by examiner

*Primary Examiner*—Peguy Jeanpierre
*Assistant Examiner*—Jean Bruner Jeanglaude
(74) *Attorney, Agent, or Firm*—Lisa K. Jorgenson; E. Russell Tarleton; Seed IP Law Group PLLC (57) ABSTRACT

A switched capacitor low-pass filter incorporates a plurality of integrator stages cascade connected together. The filter includes at least one stage that includes a circuit device for cancelling out glitch pulses. This device is a deglitching circuit provided within the filter. Preferably, each stage in the filter is formed of a deglitching device which acts as a smoothing integrator.

6 Claims, 6 Drawing Sheets

CIRCUIT DEVICE FOR CANCELLING OUT SPURIOUS PULSES IN A SWITCHED CAPACITANCE LOW-PASS FILTER, AND A FILTER INCORPORATING IT

TECHNICAL FIELD

This invention relates to a circuit device for cancelling out glitch pulses in a switched capacitor low-pass filter.

The invention also relates to a switched capacitor low-pass filter of a type which incorporates a cascade of integrator stages connected together and to the filter output, which output is fed back to the input of each stage.

BACKGROUND OF THE INVENTION

As is well known in this specific technical field, analog switched capacitor filters are at present extensively used for many audio applications.

These filters are more compact and accurate than the equally well known continuous time filters.

Figure 1:
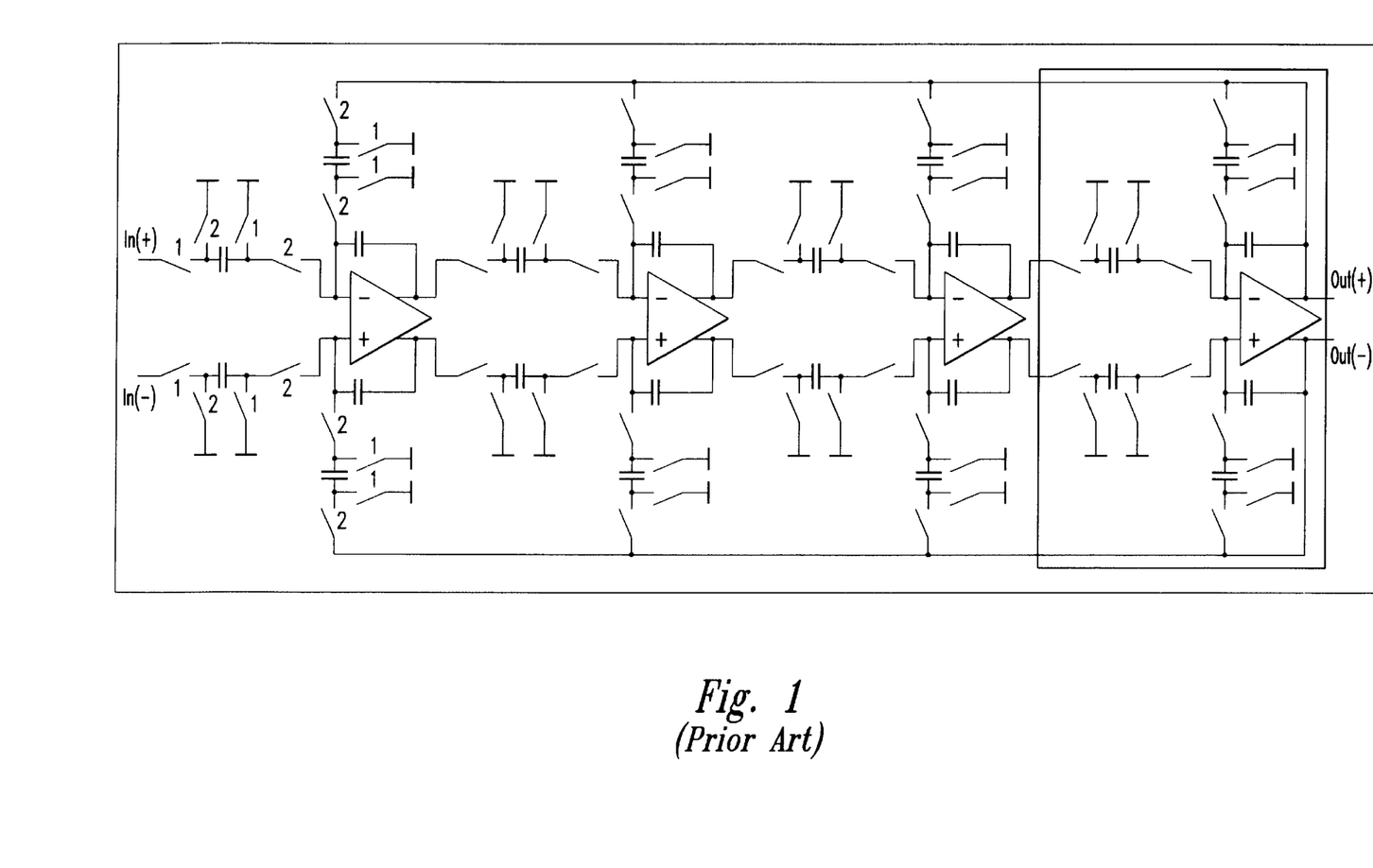
FIG. 1 is a diagrammatic view of a switched capacitor filter according to the prior art.

FIG. 1 herein illustrates schematically an embodiment of a switched capacitor low-pass filter of the fourth order. This filter is used in a D/A (Digital-to-Analog) converter effective to re-construct an audio signal, e.g., for sigma/delta applications.

The filter shown in FIG. 1 is of the IFLF type and comprises a cascade of integrator stages connected together. In addition, the filter output is feedback connected to the input of each stage.

With the filter being of the fourth order, there will be four integrator stages connected in series.

More particularly, each integrator includes an operational amplifier having two inputs and two outputs, with each output being feedback connected to a corresponding input through an integration capacitor.

Additional sampling capacitors are provided between each input and a corresponding voltage reference. Also, a pair of switching capacitors are placed between the filter output and each integrator stage.

Within the integrator, plural microswitches are arranged to switch the connections between the various capacitors and the operational amplifier.

During a first step, the switching capacitors placed at the input of each integrator stage are sampling the voltage supplied from the previous stage. During a subsequent step, these switching capacitors will transfer their stored charge to the integration capacitor which is feedback connected between outputs and inputs of the operational amplifier.

The output voltage from each operational amplifier is held "frozen" throughout the duration of the first or storage step, and will only change during the second or charge transfer step.

Figure 2:
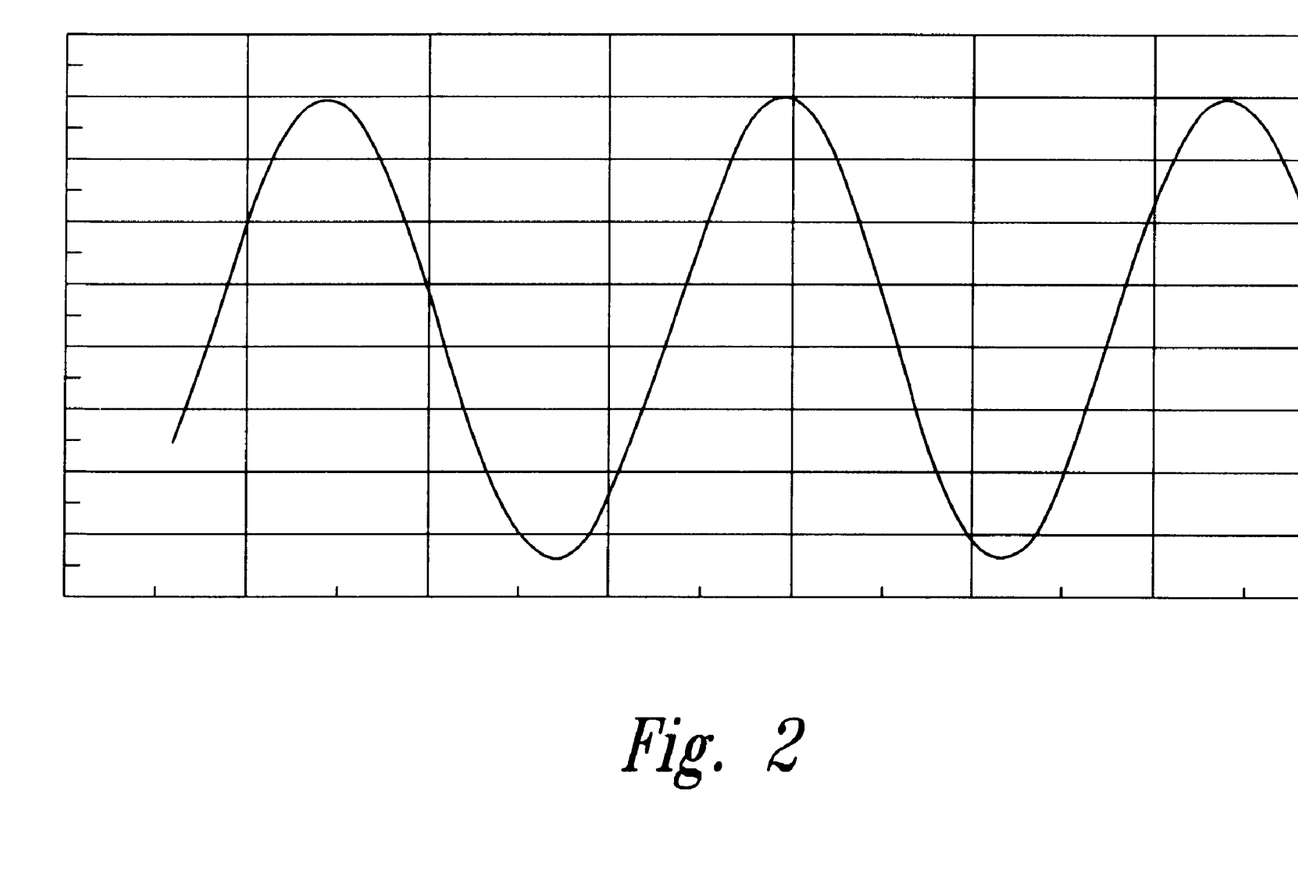
FIG. 2 is a schematic plotting of an ideal output signal from the filter of FIG. 1, when the input signal is of a sinusoidal type with high-frequency noise superposed on it.

The succession of sampling and charge transfer steps result in a filtered signal being output which obeys the curve plotted in FIG. 2 for an ideal case with the input signal being sinusoidal.

Figure 3A:
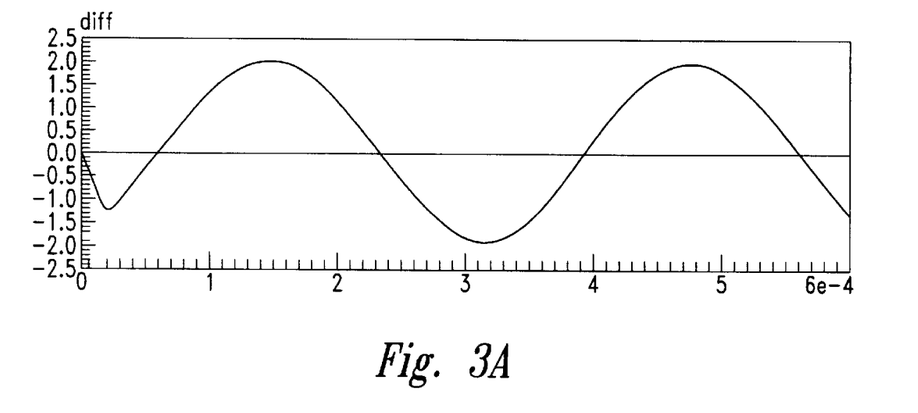
FIGS. 3a and 3b show schematically respective voltage-time waveform plottings of the output signal from a real switched capacitor filter beset with glitch pulses (glitches) occurring at each switching.
Figure 3B:
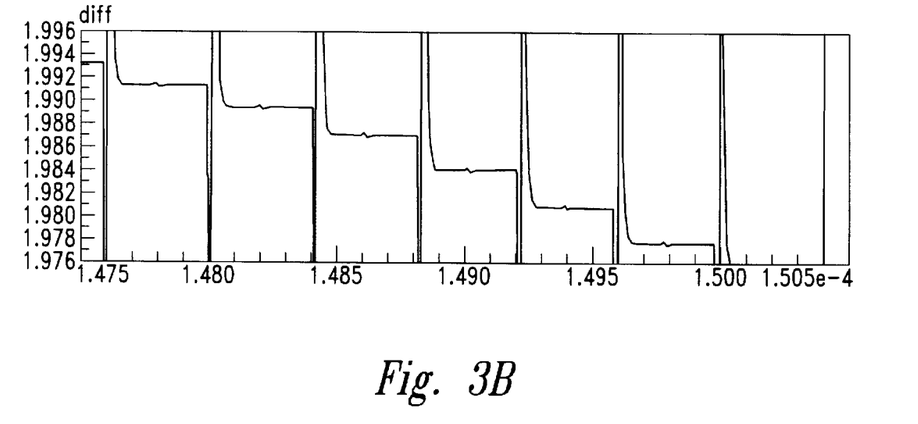

When a case with real components is considered, however, a perturbed signal is always present at the filter output due to a series of glitch pulses, known as "glitches" in the art, appearing as the microswitches close (Step 2 in FIG. 1). These pulses are repeated at each switching between the first and the second step as shown in FIGS. 3a and 3b, for example.

This effect is caused by the operational amplifiers of the integrator stages having a finite frequency response.

Normally, no serious side effects occur while the discrete time mode of operation is maintained. In fact, the switching capacitors would lock the value of the input voltage at the end of the first sampling step, that is, once the pulsive disturbance can be regarded to have been exhausted.

Where the discrete time filter is, as is often the case in the audio field, interfaced to a continuous time circuit—which usually is another low-pass filter intended for attenuating high-frequency harmonics—then the effects of glitches may become serious.

In fact, the continuous time low-pass filter would then integrate the whole signal, and the glitch pulses along with it, thereby causing distortions to occur in the output signal.

Figure 4:
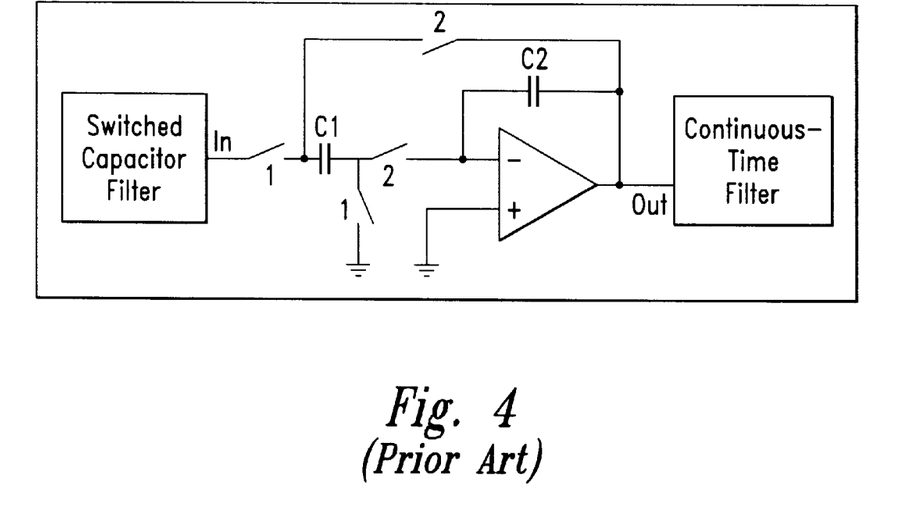
FIG. 4 shows diagrammatically a circuit solution as provided by the prior art to obviate the glitch problem.

To obviate this drawback, the prior art proposes a solution as schematically illustrated in FIG. 4.

A deglitching device or circuit is placed between the output of the switched capacitor filter and the input of the time continuous filter. This approach is a currently adopted one for commercially available D/A converters of the single-end type, although it can be used for differential applications as well.

While being in many ways advantageous and substantially achieving its objective, this prior solution cannot meet high performance requirements due to the noise introduced in the output signal.

The configuration shown in FIG. 4 actually exhibits overall noise which is the sum of the cascaded noise from the switched capacitor filter, the deglitching device, and the time continuous filter.

In essence, therefore, the signal-to-noise ratio provided by this solution is less than fully satisfactory.

SUMMARY OF THE INVENTION

An embodiment of this invention provides a circuit device which is effective to cancel out glitch pulses due to non-ideality of the operational amplifiers, at the output of a switched capacitor low-pass filter. This device has such constructional and functional features as to accommodate high signal-to-noise ratios resulting from high-performance filter operation and provides for a low introduction of noise, thereby removing the drawbacks that are besetting prior art approaches.

The device includes a smoothing integrator stage of the switched capacitor filter together with a deglitching device.

The features and advantages of the invention will be apparent from the following description of an embodiment thereof, given by way of non limitative example with reference to the accompanying drawings.

DETAILED DESCRIPTION

Figure 6:
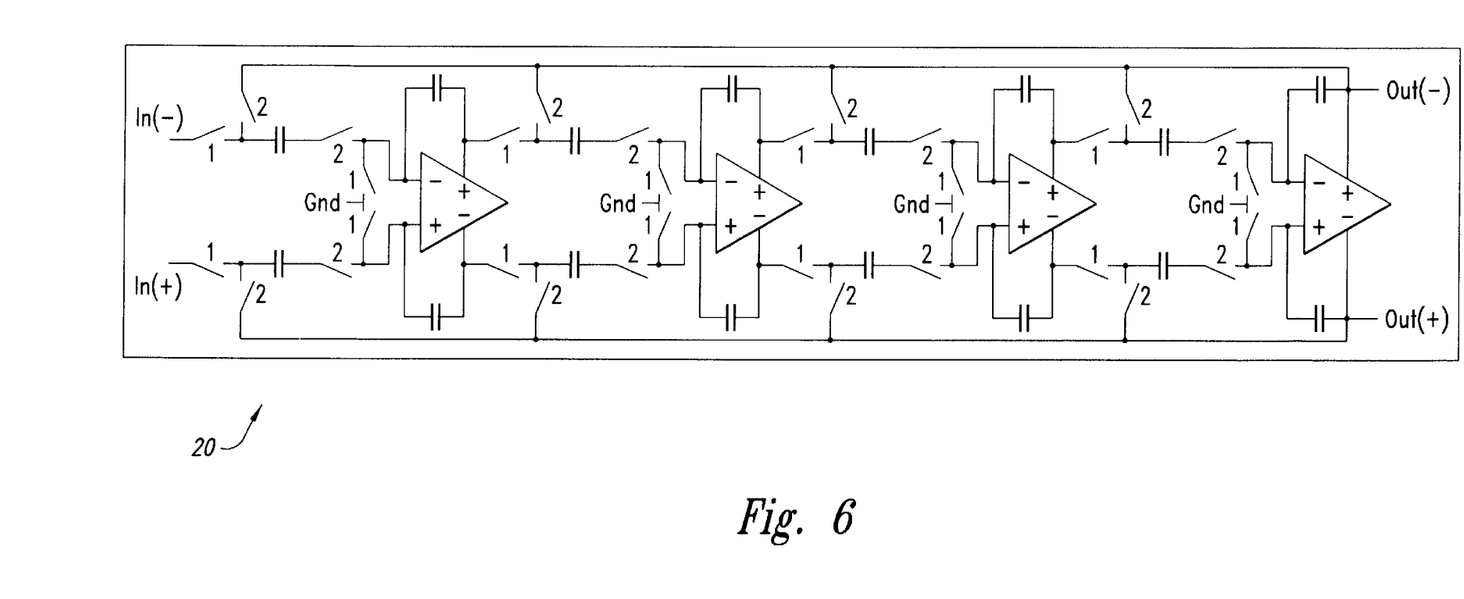
FIG. 6 shows diagrammatically a switched capacitor filter formed of a cascade of stages according to an embodiment of the invention.

With reference to the drawing figures, generally and schematically shown at 1 is a circuit device, such as a deglitching circuit, which can be used, in accordance with an embodiment of this invention, to cancel out glitches in a switched capacitor filter 20 (FIG. 6).

Figure 5:
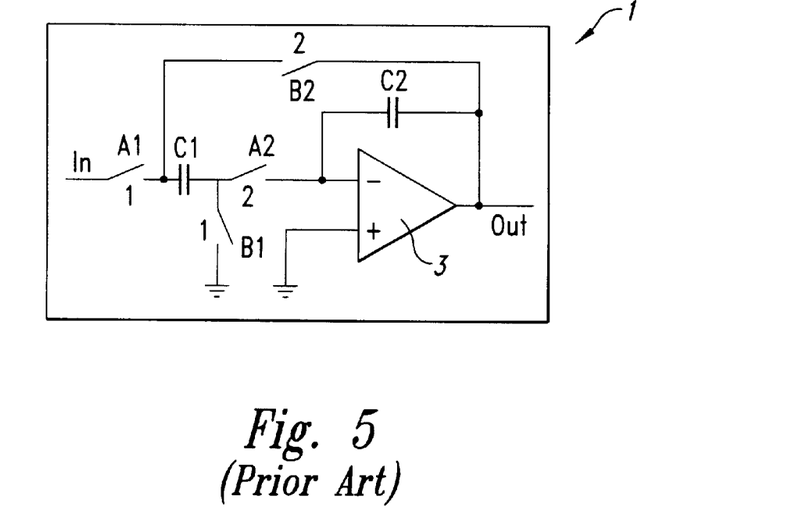
FIG. 5 shows diagrammatically a filtering stage as incorporated to a filter according to the solution shown in FIG. 4.

The device 1 includes an operational amplifier 3 having two inputs and an output.

A first, non-inverting (+) input of the amplifier 3 is connected to a voltage reference, e.g., a signal ground GND.

The second, inverting (−) input of the amplifier 3 is to receive an input signal from an input terminal IN, via a first switched capacitor C1.

A first switch A1 is placed between the input terminal IN and one end of the first capacitor C1, and a second switch A2 is placed between the other end of the capacitor C1 and the inverting (−) input of the operational amplifier 3.

In addition, a third switch B1 is provided between the inverting (−) input of the amplifier 3 and the signal ground GND.

Advantageously, a second capacitor C2 is connected in a feedback connection between the output OUT and the inverting (−) input of the operational amplifier 3.

Also, a fourth switch B2 is connected between the output OUT of the amplifier 3 and the first end of the first capacitor C1, downstream of the first switch A1.

All the switches incorporated to the device 1 can be in the form of controlled microswitches, such as transistors.

The first capacitor C1 will sample the signal present at the input terminal IN during a first sampling step.

During a second successive step, the capacitor C1 is placed in parallel with the second capacitor C2, and the electric charge previously stored in the capacitor C1 during the first step is re-distributed between the two capacitors, C1 and C2. The charge transfer is effected through the external circuit link of the amplifier 3, specifically that including the fourth switch B2.

Advantageously, therefore, the operational amplifier 3 is not required to supply current during the switching transients between the first and the second step. Accordingly, no glitch voltage pulses will be produced on the signal presented at the output OUT.

It should be noted that the device 1 represents a low-pass stage which can be used to implement a switched capacitor filter, as shown in FIG. 6.

Advantageously, the device 1 can, in fact, replace the smoothing integrator representing the final stage of the filter shown in FIG. 1.

More particularly, assuming a low-frequency gain of unity, the device 1 could also replace each of the integrator stages shown in FIG. 1.

For example, in a preferred embodiment, all the integrator stages of a switched capacitor low-pass filter are implemented, according to one embodiment of the invention, by the device 1 of FIG. 5.

For example, as shown in FIG. 6, a fourth-order switched capacitor filter 20 is implemented by a cascade of integrator stages each having an intrinsic glitch-cancelling characteristic. The respective outputs of the filter shown in FIG. 6 are fed back as appropriate to the differential inputs of each integrator stage.

In essence, the switched capacitor filter 20 is formed of a cascade of deglitching devices, each operated as an integrator and the last operated as a smoothing integrator.

The filter 20 has a major advantage in that its circuit area requirements are low, as are the power consumption and noise involved.

Figure 7:
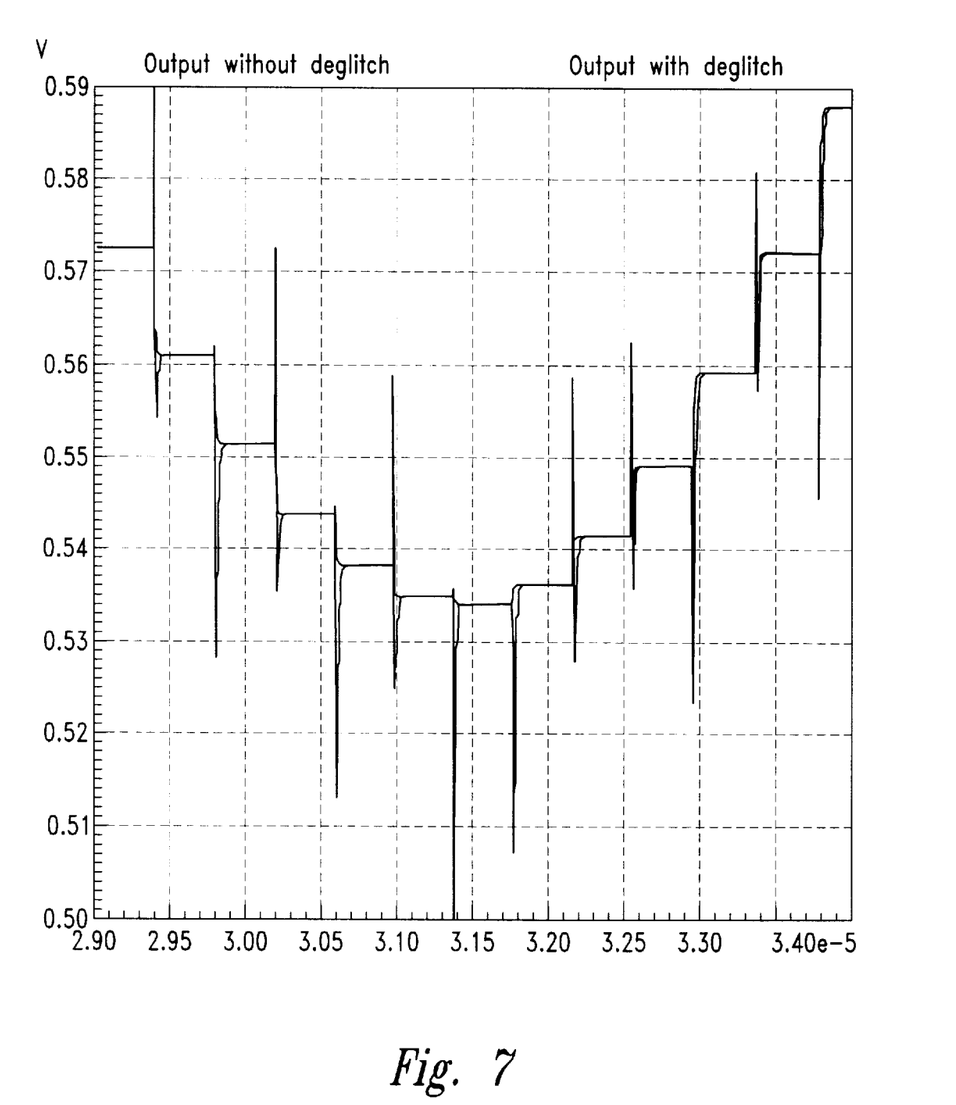
FIG. 7 shows comparative plottings of the outputs from a filter according FIG. 6 and a conventional design filter.

FIG. 7 shows comparative plottings of output signals from the filter 20 shown in FIG. 6, and from a conventional type of filter.

The important benefits in terms of glitch smoothing provided by this invention can be readily appreciated from this graph.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A low-pass filter circuit having a pair of inputs and a pair of outputs, the filter circuit comprising:
    a plurality of filter stages, each filter stage comprising:
        an integrator stage having first and second input terminals and first and second output terminals;
        first and second sampling capacitors connected in series between the respective integrator stage input terminals, via respective first and second sampling switches, and first and second input switches respectively;
        first and second feedback switches coupled to the respective filter circuit outputs, and to the connection of the first and second sampling capacitors with the respective first and second input switches; and
        the first and second input switches coupled to the respective first and second inputs of the filter circuit in the case of a first filter stage, and otherwise coupled to the respective first and second output terminals of a preceding integrator stage.

2. The filter circuit of claim 1, wherein the integrator stage comprises an operational amplifier and wherein the first and second input terminals comprise, respectively, non-inverting and inverting inputs of the operational amplifier, and the first and second output terminals comprise first and second outputs of the operational amplifier.

3. The filter stage of claim 2, wherein first and second reference switches are coupled between a voltage reference and the respective connection of each of the first and second sampling capacitors with the first and second sampling switches.

4. A switched capacitor low-pass filter of multiple order, comprising: first and second filter inputs and first and second filter outputs; and a cascade of filter stages, each filter stage comprising:
    an integrator circuit having
        first and second input terminals and first and second output terminals;
        first and second sampling capacitors connected in series between the respective integrator stage input terminals, via respective first and second sampling switches and first and second input switches, respectively;
        first and second feedback switches coupled to the respective first and second filter outputs, and to the connection of the first and second sampling capacitors with the respective first and second input switches; and first and second input switches coupled to the respective first and second inputs in the case of a first stage filter, and otherwise coupled to the respective first and second output terminals of a preceding integrator circuit; and a final filter stage provided within the filter and configured to serve as asmoothing integrator stage.

5. The filter of claim 4, wherein each integrator circuit comprises an operational amplifier and wherein the first and second input terminals comprise, respectively, non-inverting and inverting inputs of the operational amplifier and the first and second output terminals comprise first and second outputs of the operational amplifier.

6. The filter of claim 5 wherein each integrator stage further includes:

first and second reference switches coupled between a voltage reference and the respective connection of each of the first and second sampling capacitors with the respective first and second sampling switches.

* * * * *

UNITED STATES PATENT AND TRADEMARK OFFICE
CERTIFICATE OF CORRECTION

| | |
|---|---|
| PATENT NO. | : 6,441,762 B2 |
| APPLICATION NO. | : 09/340177 |
| DATED | : August 27, 2002 |
| INVENTOR(S) | : Marco Angelici et al. |

It is certified that error appears in the above-identified patent and that said Letters Patent is hereby corrected as shown below:

The title page should be deleted and substitute therefore the attached title page as shown on the attached page.

Signed and Sealed this

Nineteenth Day of September, 2006

JON W. DUDAS
*Director of the United States Patent and Trademark Office*

(12) United States Patent
Angelici et al.

(10) Patent No.: US 6,441,762 B2
(45) Date of Patent: *Aug. 27, 2002

(54) CIRCUIT DEVICE FOR CANCELLING OUT SPURIOUS PULSES IN A SWITCHED CAPACITANCE LOW-PASS FILTER, AND A FILTER INCORPORATING IT

(75) Inventors: Marco Angelici, Galliate Lombardo; Marco Ronchi, Cavenago Brianza, both of (IT)

(73) Assignee: STMicroelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,177

(22) Filed: Jun. 25, 1999

(30) Foreign Application Priority Data

Jun. 26, 1998 (EP) .............................. 98830386

(51) Int. Cl.[7] .................... H03M 1/66; H03M 1/12
(52) U.S. Cl. .................... 341/150; 341/172; 327/95; 327/96
(58) Field of Search ..................... 341/150, 172; 327/95, 96

(56) References Cited

U.S. PATENT DOCUMENTS 5,391,999 A  2/1995  Early et al. ............... 327/337
5,689,201 A * 11/1997  Temes et al. .............. 327/95

OTHER PUBLICATIONS

Fischer, G.; Davis, A. J. "VLSI implementation of a wideband sonar receiver" 2000 IEEE International Symposium vol. 5, pp. 673–676.*

Taylor, J.T. et al., "Realisation of High Frequency GaAs Switched Capacitor Filters Using Insulated Gate Switches," *Analog Circuits And Neural Networks*, Singapore, Jun. 11–14, 1991, pp. 1661–1664, XP000370923, *Institute of Electrical Engineers*.

* cited by examiner

*Primary Examiner*—Peguy Jeanpierre
*Assistant Examiner*—Jean Bruner Jeanglaude
(74) *Attorney, Agent, or Firm*—Lisa K. Jorgenson; E. Russell Tarleton; Seed IP Law Group PLLC (57) ABSTRACT

A switched capacitor low-pass filter incorporates a plurality of integrator stages cascade connected together. The filter includes at least one stage that includes a circuit device for cancelling out glitch pulses. This device is a deglitching circuit provided within the filter. Preferably, each stage in the filter is formed of a deglitching device which acts as a smoothing integrator.

6 Claims, 6 Drawing Sheets